(12) United States Patent
Lu et al.

(10) Patent No.: US 11,854,980 B2
(45) Date of Patent: Dec. 26, 2023

(54) METHOD FOR FORMING TITANIUM NITRIDE BARRIER WITH SMALL SURFACE GRAINS IN INTERCONNECTS

(71) Applicant: TAIWAN SEMICONDUCTOR MANUFACTURING CO., LTD., Hsinchu (TW)

(72) Inventors: Chi-Ming Lu, Kaohsiung (TW); Jung-Chih Tsao, Tainan (TW); Yao-Hsiang Liang, Hsinchu (TW); Chih-Chang Huang, Chiayi (TW); Han-Chieh Huang, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 119 days.

(21) Appl. No.: 17/011,561

(22) Filed: Sep. 3, 2020

(65) Prior Publication Data

US 2020/0402916 A1 Dec. 24, 2020

Related U.S. Application Data

(62) Division of application No. 15/688,936, filed on Aug. 29, 2017, now Pat. No. 10,796,996.

(Continued)

(51) Int. Cl.
*H01L 21/768* (2006.01)
*H01L 23/522* (2006.01)
(Continued)

(52) U.S. Cl.
CPC .. *H01L 23/53266* (2013.01); *H01L 21/76802* (2013.01); *H01L 21/76846* (2013.01); *H01L 21/76856* (2013.01); *H01L 23/5226* (2013.01)

(58) Field of Classification Search
CPC ......... H01L 23/53266; H01L 21/76802; H01L 21/76846; H01L 21/76856; H01L 23/5226
See application file for complete search history.

(56) References Cited

U.S. PATENT DOCUMENTS 5,420,072 A * 5/1995 Fiordalice ......... H01L 21/76876
438/607
6,187,673 B1 * 2/2001 Lai .................... H01L 21/28556
257/E21.17

(Continued)

OTHER PUBLICATIONS

Kroger, Plasma induced microstructural, compositional, and resistivity changes in ultrathin chemical vapor deposited titanium nitride films, Journal of Applied Physics, 91(8):5149, Jan. 2002, available at https://aip.scitation.org/doi/10.1063/1.1459750 (Year: 2002).*

*Primary Examiner* — Marcos D. Pizarro
*Assistant Examiner* — Tenley H Schofield
(74) *Attorney, Agent, or Firm* — Birch, Stewart, Kolasch & Birch, LLP

(57) ABSTRACT

A method of forming a semiconductor device, comprising: forming a first conductive layer on an active device of a substrate; forming a dielectric layer on the first conductive layer; forming a through hole passing through the dielectric layer to expose a portion of the first conductive layer; conformally depositing a glue layer in the through hole to cover the portion of the first conductive layer comprising: forming a plurality of isolated lattices in an amorphous region at which the isolated lattices are uniformly distributed and extend from a top surface of the glue layer and terminate prior to reach a bottom of the glue layer, wherein the glue layer has a predetermined thickness; depositing a conductive material on the glue layer within the through hole, thereby forming a contact via; and forming a second conductive layer on the contact via over the first conductive layer.

20 Claims, 18 Drawing Sheets

Related U.S. Application Data

(60) Provisional application No. 62/469,563, filed on Mar. 10, 2017.

(51) Int. Cl.
*H01L 23/00* (2006.01)
*H01L 23/31* (2006.01)
*H01L 23/495* (2006.01)
*H01L 23/528* (2006.01)
*H01L 23/532* (2006.01)
*H01L 25/065* (2023.01)

(56) References Cited

U.S. PATENT DOCUMENTS

| | | | |
|---|---|---|---|
| 2002/0050648 A1* | 5/2002 | Kishida | H01L 21/7684 257/E21.585 |
| 2004/0166376 A1 | 8/2004 | Kirino et al. | |
| 2004/0183201 A1* | 9/2004 | Shimada | H01L 23/53238 257/762 |
| 2006/0014052 A1 | 1/2006 | Watanabe et al. | |
| 2007/0026673 A1* | 2/2007 | Takayama | H01L 21/76808 438/682 |
| 2008/0296660 A1 | 12/2008 | Park et al. | |
| 2009/0047780 A1 | 2/2009 | Huang et al. | |
| 2009/0246952 A1 | 10/2009 | Shizaka et al. | |
| 2009/0302474 A1 | 12/2009 | Barmak et al. | |
| 2010/0007022 A1 | 1/2010 | Tarumi et al. | |
| 2010/0151676 A1* | 6/2010 | Ritchie | H01L 21/76846 438/660 |
| 2011/0223772 A1 | 9/2011 | Mayer et al. | |
| 2013/0069234 A1* | 3/2013 | Lee | H01L 21/32134 257/E23.141 |
| 2015/0243730 A1* | 8/2015 | Cheng | H01L 21/76841 438/653 |
| 2017/0018439 A1 | 1/2017 | Wang et al. | |

* cited by examiner

METHOD FOR FORMING TITANIUM NITRIDE BARRIER WITH SMALL SURFACE GRAINS IN INTERCONNECTS

PRIORITY CLAIM AND CROSS-REFERENCE

The present application is a Divisional Application of the U.S. application Ser. No. 15/688,936, filed Aug. 29, 2017, which claims priority of U.S. Provisional Application Ser. No. 62/469,563, filed Mar. 10, 2017, all of which are herein incorporated by reference in their entireties.

BACKGROUND

Integrated circuit fabrication may include a front-end-of-line process, in which one or more electrical devices such as transistors, capacitors, resistors, etc., are formed on a semiconductor wafer. Integrated circuit fabrication may also include a back-end-of-line (BEOL) process, in which electrical devices are interconnected on the semiconductor wafer.

The back-end-of-line process is used to interconnect the plurality of semiconductor devices with wiring on the wafer and is also used to form contacts, insulating layers (dielectrics), metal levels, and bonding sites for chip-to-package connections. BEOL interconnects, including metal wiring lines (i.e. conductive layers) and inter-level vias, carry direct current (DC) in the integrated circuits. Within BEOL interconnect structures, metal wiring lines run parallel to the substrate, and conductive vias run perpendicular to the substrate, with the conductive vias interconnecting different levels of the metal wiring lines.

Generally, a connection between conductive vias and metal lines is enhanced by a glue layer, and the glue layer also plays a role to restrict diffusion of elements. However, the diffusion of elements cannot be effectively restricted by the known glue layer. Therefore, it is necessary to develop a glue layer and a method of forming the same to tackle the above problem.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
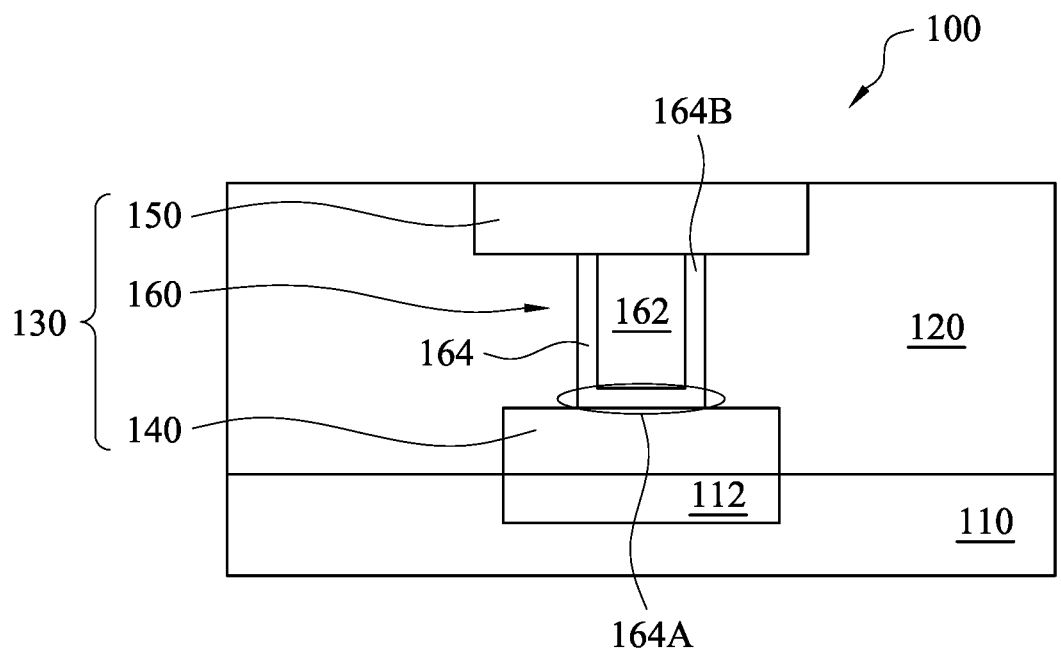
FIG. 1A is a schematic cross-sectional view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A conductive stack includes conductive layers and a contact structure between two of the conductive layers, and the conductive stack is electrically connected to an active device on a substrate of a semiconductor device, thereby further connecting the semiconductor device to another semiconductor device through the conductive stack. The contact structure further includes a contact via and a glue layer conformally formed on sidewalls and a bottom surface of the contact via. However, elements (e.g. tungsten (W) and copper (Cu)) in the contact via and/or in the conductive layers may diffuse out through the glue layer during an operation of connecting the semiconductor device to another semiconductor device, since a high density of grain boundaries (i.e. a large amount of the lattices in the glue layer are aggregately formed) of lattices existing in the glue layer have a weak ability to restrict the diffusion of the elements. It is found that a plasma operation for forming the lattices contributing to the aggregately formed lattices due to a higher power applied to the operation. Besides, with the increasing amount of the lattices, a carbon content of the glue layer decreases.

Embodiments of the present disclosure are directed to providing a semiconductor device and a method of forming the same. Diffusion of the elements is avoided in the present disclosure by the glue layer having isolated lattices and an amorphous region at which the isolated lattices are uniformly distributed. In some embodiments, the isolated lattices in thin sub-layers (i.e. amorphous layer) of the glue layer are formed by a low-power plasma operation to increase carbon content in the amorphous region, thereby improving an ability of restricting the diffusion of elements.

The term of "aggregately formed" refers to several lattices sharing a grain boundary.

The term of "isolated lattice" refers to lattices formed separately, in which each of the lattices has its own grain boundary.

The term of "amorphous region" refers to all amorphous layers or sub-layers of the overall glue layer except for the isolated lattices.

Referring to FIG. 1A, which illustrates a schematic cross-sectional view of a semiconductor device 100 in accordance of some embodiments of the present disclosure. The semiconductor device 100 includes a substrate 110, a dielectric layer 120 disposed on the substrate 110, and a conductive stack 130. The substrate 110 may have an active device 112, and the conductive stack 130 is electrically connected to the active device 112. The conductive stack 130 includes at least one first conductive layer 140, a second conductive layer 150 disposed over the first conductive layer 140 and a contact structure 160 disposed between the first conductive layer 140 and the second conductive layer 150. The contact structure 160 includes a contact via 162 and a glue layer 164 conformal to sidewalls and a bottom surface of the contact via 162. The contact via 162 electrically connects the first conductive layer 140 to the second conductive layer 150.

In one embodiment, the semiconductor device 100 may be an image signal processor (ISP). In some embodiments, the contact via 162 includes tungsten (W) and the glue layer 164 includes titanium nitride (TiN). In some embodiments, a thickness of the glue layer 164 is preferably in a range substantially from 235 Å to 260 Å. When the glue layer 164 is too thick, conductivity of the conductive stack 130 decreases and an electrical connection between two semiconductor devices becomes poor. In some embodiments, the first conductive layer 140 and the second conductive layer 150 respectively include silicon (Si), aluminum (Al), silicide, or copper (Cu). Although the present embodiment illustrates only one first conductive layer 140, it is understood that any number of the first conductive layer is within the scope of the present disclosure. The conductive stack 130 may be taken as an interconnection structure of the semiconductor device 100, and the interconnection structure may be used to construct an electrical connection between two devices, such as an image signal processor and an image sensor in some embodiments.

Figure 1B:
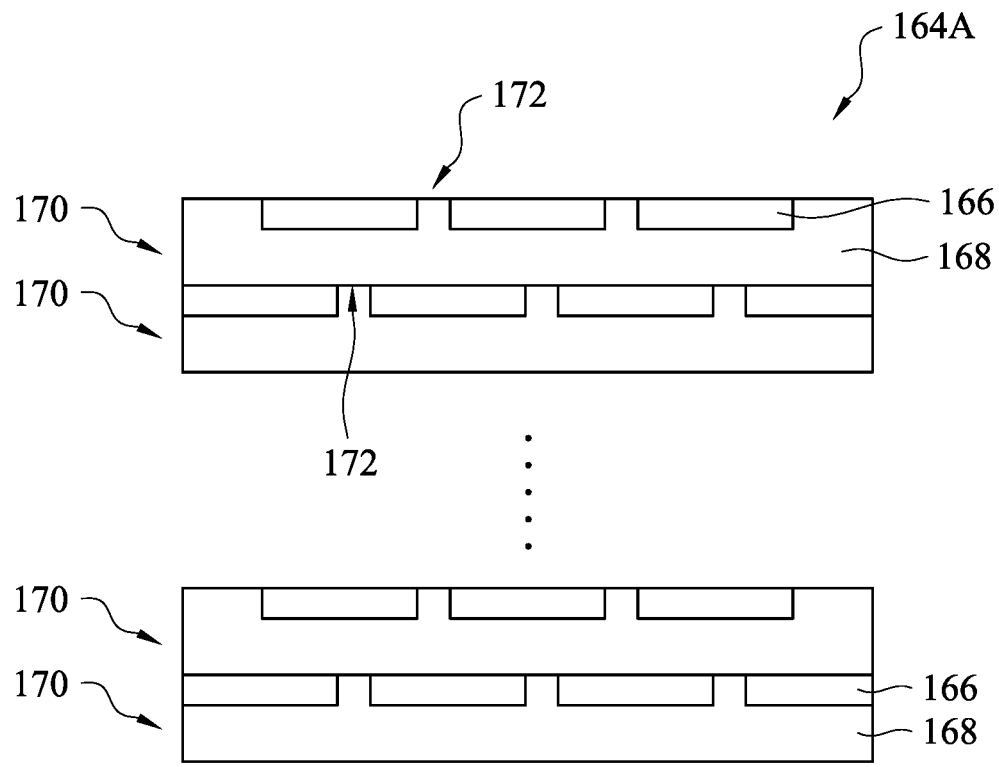
FIG. 1B and FIG. 1C are enlarged views of a microstructure of a bottom portion of a glue layer in accordance with some embodiments of the present disclosure.
Figure 1C:
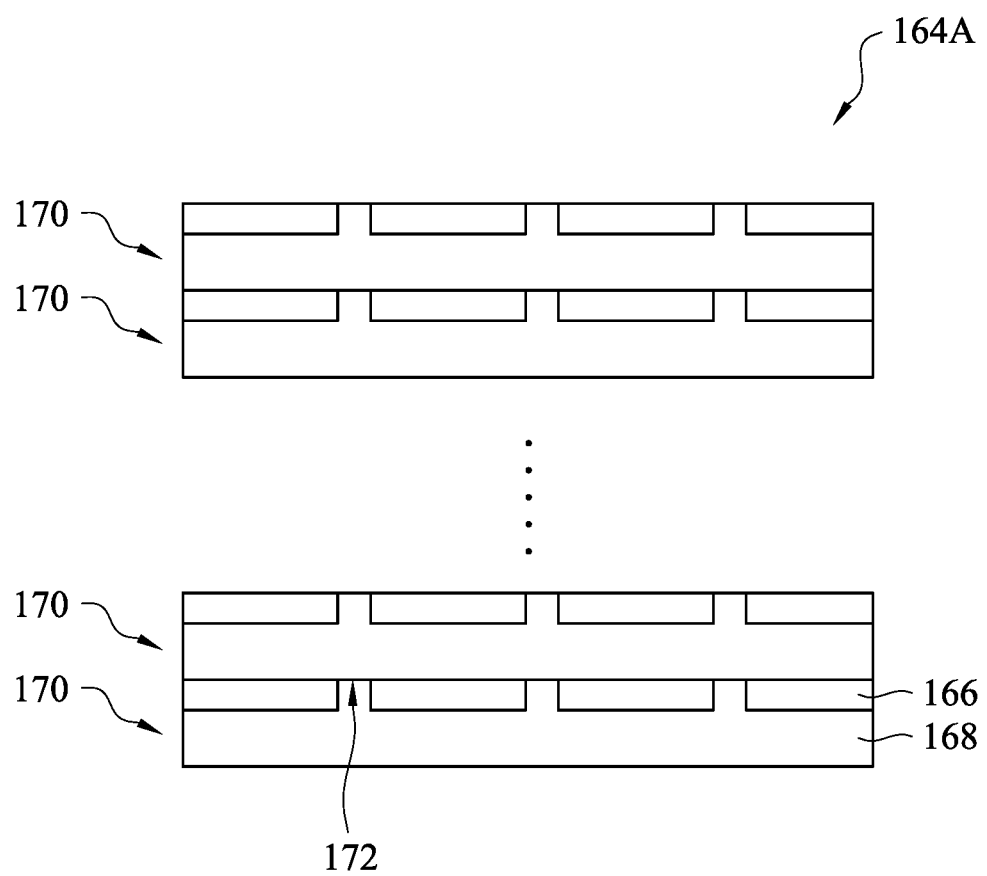

The glue layer 164 has a bottom portion 164A and a sidewall portion 164B both of which have the same microstructures. Hereinafter, only the bottom portion 164A is illustrated for explanation. Referring to FIG. 1B and FIG. 1C, FIG. 1B and FIG. 1C illustrate enlarged views of microstructures of the bottom portion 164A of the glue layer 164 of FIG. 1A in accordance with some embodiments of the present disclosure. As shown in FIG. 1B and FIG. 1C, the bottom portion 164A of the glue layer 164 includes one or more sub-layers 170, and each sub-layer 170 has an amorphous region 168 and plural isolated lattices 166 uniformly distributed in the amorphous region 168. In some embodiments, the isolated lattices 166 in each of two adjacent sub-layers 170 may be alternately disposed (as shown in FIG. 1B) or aligned with each other (as shown in FIG. 1C). In some embodiments, the glue layer 164 contains 10 atomic percent (at. %) to 30 at. % of carbon. In some embodiments, each of the sub-layers 170 has a thickness in a range substantially from 30 Å to 40 Å. When the carbon content of the glue layer 164 is greater than 30 at. % or the thickness of each of the sub-layers 170 is greater than 40 Å, conductivity of the conductive stack 130 decreases and an electrical connection between two semiconductor devices becomes worse. On the other hand, when the carbon content is smaller than 10 at. % or the thickness of each of the sub-layers 170 is smaller than 30 Å, the density of the grain boundaries of the isolated lattices increases, and the diffusion of the elements in the contact via or the conductive layers may not be restricted.

Figure 2A:
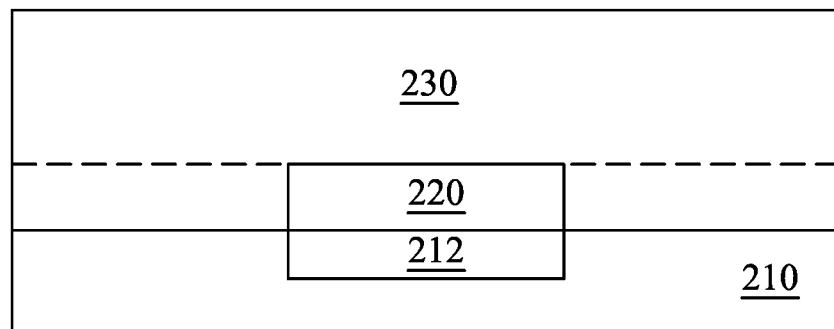
FIG. 2A to FIG. 2I are schematic cross-sectional views of intermediate stages showing a method for forming a semiconductor device in accordance with various embodiments of the present disclosure.

Referring to FIG. 2A to FIG. 2I, FIG. 2A to FIG. 2I are schematic cross-sectional views of intermediate stages showing a method for forming a semiconductor device in accordance with various embodiments of the present disclosure. As shown in FIG. 2A, a first conductive layer 220 is formed on an active device 212 of a substrate 210, and then a dielectric layer 230 is formed on the first conductive layer 220. The active device 212 of the substrate 210 is electrically connected to the first conductive layer 220. In some embodiments, the first conductive layer 220 is formed within a dielectric layer having the same or similar material as the dielectric layer 230 by a suitable process such as a damascene process, in which a dotted line shows an interface between the dielectric layer of the first conductive layer 220 and the dielectric layer 230. The damascene process includes forming a dielectric layer on the substrate, etching the dielectric layer using a mask to form a through hole to expose a portion of the substrate, selectively forming a barrier layer in the through hole, and depositing the conductive layer in the through hole. In some embodiments, the first conductive layer 220 includes silicon, aluminum, silicide, or copper. In some embodiments, there may be plural first conductive layers electrically connecting to each other. In some embodiments, the dielectric layer 230 may be formed from a material includes silicone oxides ($SiO_2$) or other suitable insulating materials. In some embodiments, depositing the dielectric layer 230 may be performed by any suitable process such as spin-on coating, chemical vapor deposition (CVD), atomic layer deposition (ALD), high density plasma CVD (HPCVD), low pressure CVD (LPCVD), metal organic CVD (MOCVD), remote plasma CVD (RPCVD), plasma enhanced CVD (PECVD) or other suitable processes, or combinations thereof.

Figure 2B:
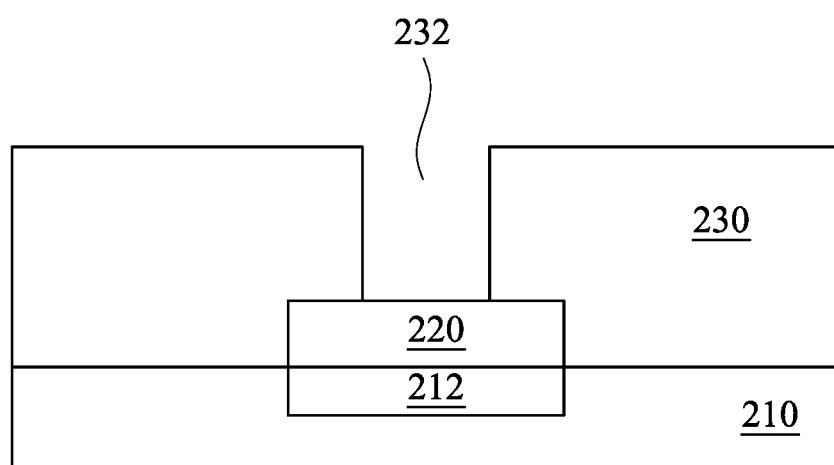

In FIG. 2B, a through hole 232 is formed in the dielectric layer 230, in which the through hole 232 passes through the dielectric layer 230 and exposes a portion of the first conductive layer 220. The through hole 232 may be formed by patterning a photoresist layer (not shown) formed on the dielectric layer 230, followed by etching the dielectric layer 230 using the patterned photoresist layer as a mask. The photoresist layer is then stripped, leaving the through hole 232 within the dielectric layer 230.

Figure 2C:
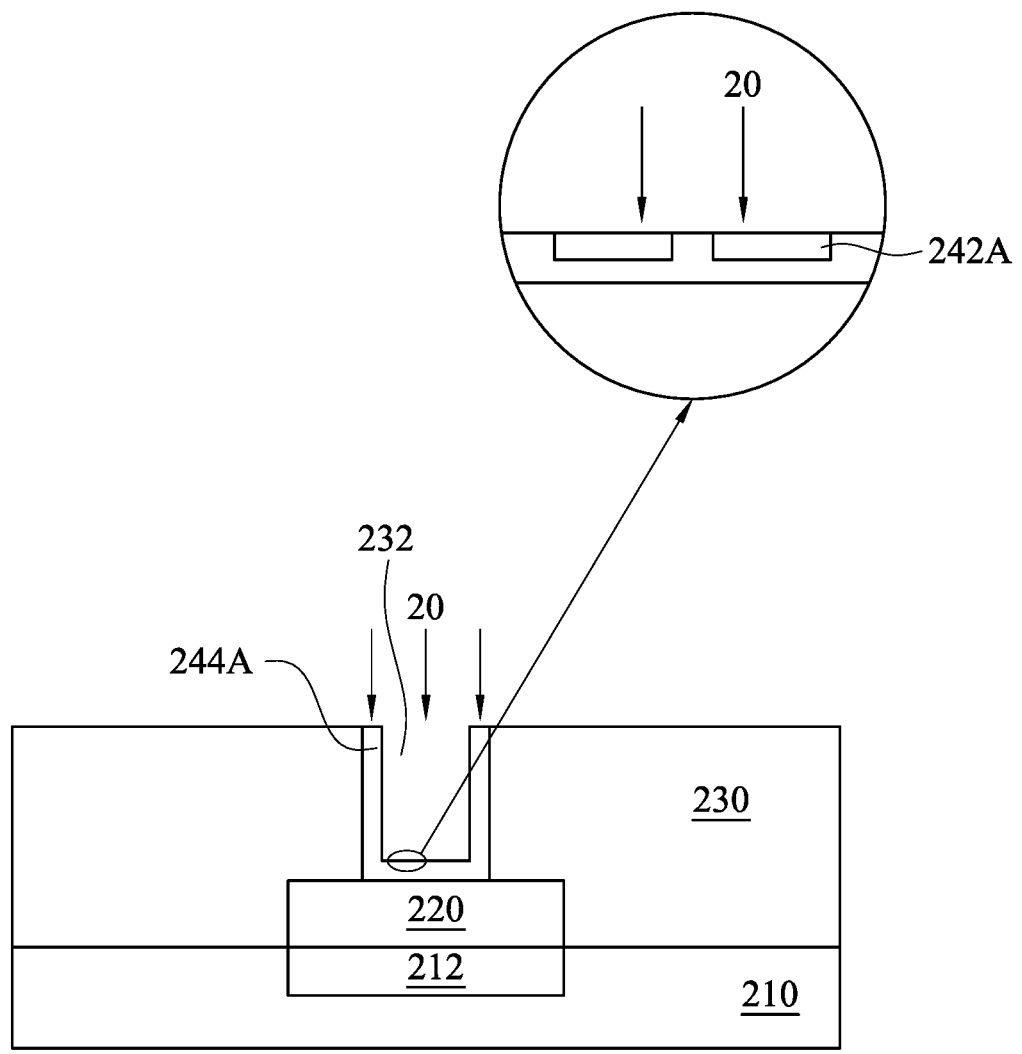
Figure 2D:
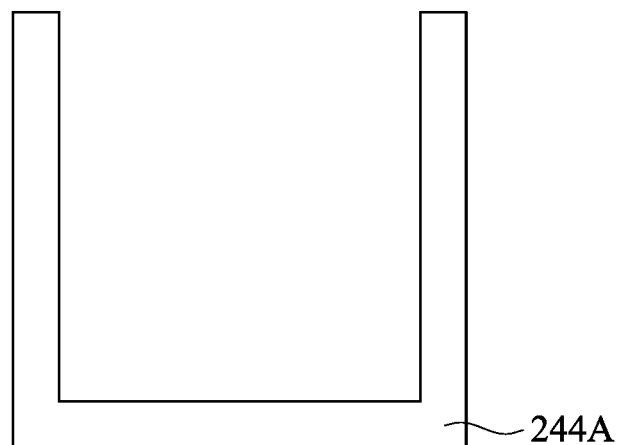
Figure 2E:
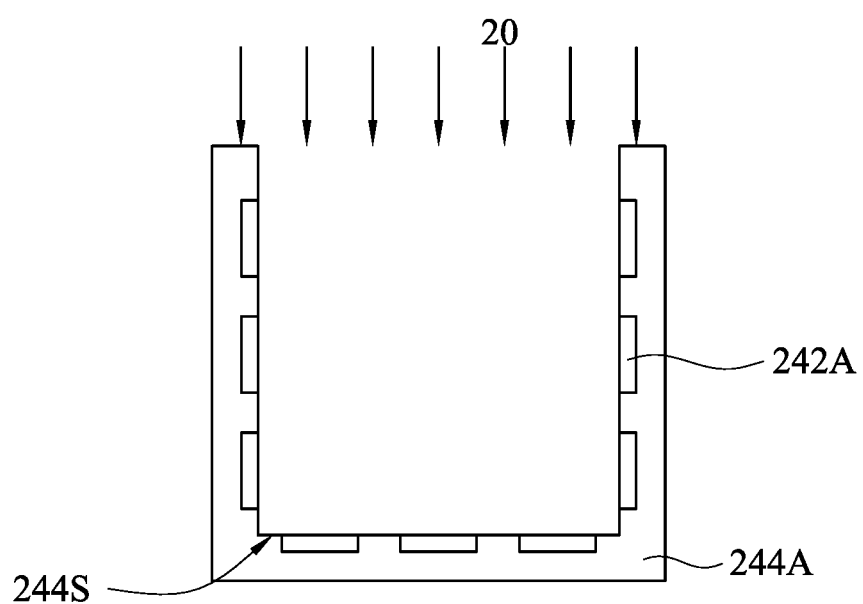
Figure 2F:
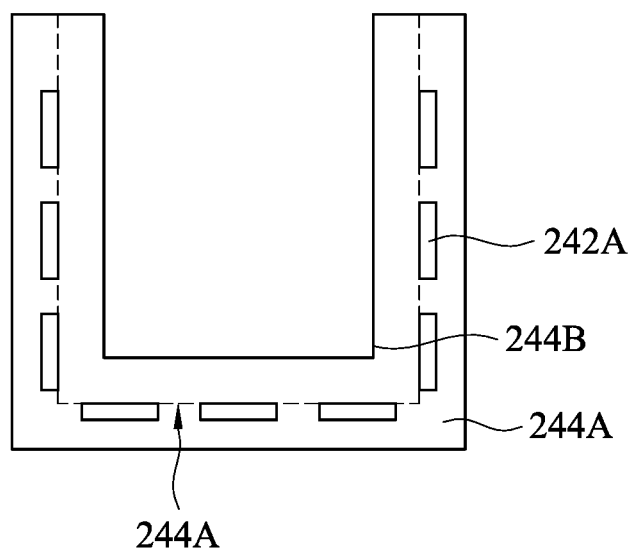

Referring to FIG. 2C, an amorphous layer 244A is conformally deposited in the through hole 232 to cover the exposed portion of the first conductive layer 220 and sidewalls of the through hole 232, followed by forming isolated lattices 242A in the amorphous layer 244A. The isolated lattices 242A are uniformly distributed in the amorphous layer 244A. In some embodiments, operations of depositing the amorphous layer and forming the isolated lattices are alternately performed. Referring to FIG. 2D to FIG. 2G, FIG. 2D to FIG. 2G illustrate detailed schematic cross-sectional views of the alternate operations, and the through hole is omitted to simplify the figures. In FIG. 2D, an amorphous layer 244A is deposited by a process such as CVD, ALD, HPCVD, LPCVD, MOCVD, RPCVD, PECVD or other suitable process in the through hole (not shown). Then, as shown in FIG. 2E, isolated lattices 242A are formed on a surface 244S of the amorphous layer 244A by a plasma operation (e.g. a low-power plasma operation 20). Next, as shown in FIG. 2F, another amorphous layer 244B is deposited on the surface 244S of the amorphous layer 244A. A dotted line shows an interface between the amorphous layers 244A and 244B. Another plasma operation (e.g. a low-power plasma operation 20) is performed on a surface 244S' of the amorphous layer 244B to form isolated lattices 242B in the amorphous layer 244B. In some embodiments, the low-power plasma operation 20 has a power in a range substantially lower than 1000 watts (W). When the power is greater than 1000 W, the lattices are aggregately formed and a problem of the diffusion of the elements cannot be improved. In some embodiments, the low-power plasma operation 20 may be performed under a pressure in a range substantially from 1.8 torr to 2.5 torr. When the pressure is smaller than 1.8 torr, the low-power plasma operation may not be successfully performed. In some embodiments, the amorphous layer may be formed by alternately using tetrakis (dimethylamido)titanium (TDMAT) and a nitrogen-containing gas as reactant gases under a temperature, for example, 400° C. In some embodiments, the nitrogen-containing gas may be ammonia ($NH_3$), while the nitrogen containing gas may be a mixture of hydrogen gas ($H_2$) and nitrogen gas ($N_2$).

Figure 2G:
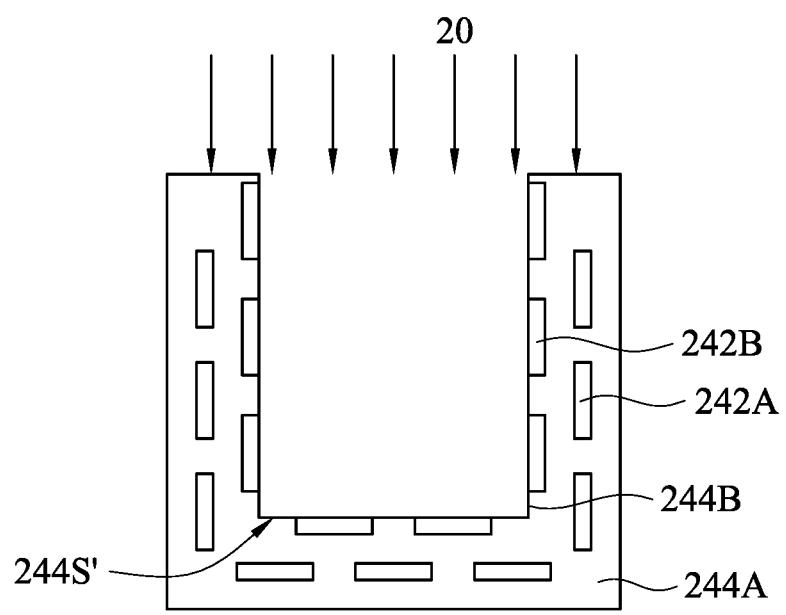
Figure 2H:
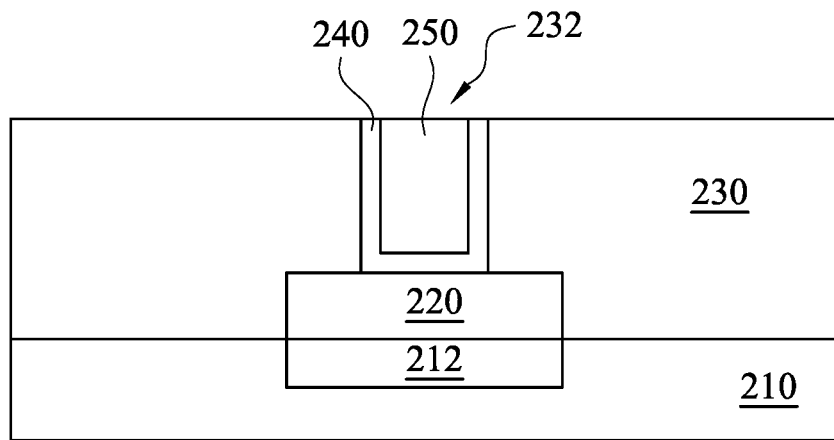

Repeating the operations shown in FIG. 2D to FIG. 2G for several times, for example, 8 to 20 amorphous layers (i.e. sub-layers) may be deposited and isolated lattices are formed in each of the amorphous layers, a glue layer 240 having a predetermined thickness may be formed (as shown in FIG. 2H). In some embodiments, the glue layer 240 may include titanium nitride (TiN). In some embodiments, the isolated lattices (e.g. isolated lattices 242A and 242B) in each of the amorphous layers (e.g. the amorphous layer 244A and the amorphous layer 244B) may be alternately formed in each of two adjacent amorphous layers, as shown in FIG. 2G. In other embodiments, the isolated lattices in each of the amorphous layers may be aligned with each other. In some embodiments, the predetermined thickness of the glue layer 240 is in a range substantially from 235 Å to 260 Å. When the glue layer 240 is too thick, a resistance of the glue layer 240 increases, and an electrical connection between two semiconductor devices becomes poor. In some embodiments, a thickness of the amorphous layer is in a range substantially from 30 Å to 40 Å. In some embodiments, the amorphous layers such as the amorphous layer 244A, the amorphous layer 244B and other amorphous layers of the glue layers 240) form an amorphous region, and the amorphous region contains 10 at. % to 30 at. % of carbon. When the carbon content of the amorphous layers is greater than 30 at. % or the thickness of the amorphous layer is greater than 40 Å, a resistance of the glue layer 240 increases and an electrical connection between two semiconductor devices becomes worse. On the other hand, when the carbon content is smaller than 10 at. % or the thickness of the amorphous layer is smaller than 30 Å, the density of the grain boundaries of the isolated lattices increases, and the diffusion of the elements in the contact via or the conductive layers may not be restricted.

Referring to FIG. 2H, a contact via 250 is formed on the glue layer 240 within the through hole 232 by depositing a conductive material. The deposition process may be, for example, CVD, ALD, HPCVD, LPCVD, MOCVD, RPCVD, PECVD or other suitable process. In some embodiments, the conductive material may be tungsten (W) or any other suitable material. A chemical mechanical polishing (CMP) may be alternatively performed after the material of the conductive via 250 is deposited, so as to remove excess conductive material and flatten surfaces of the contact via 250 and the dielectric layer 230.

Figure 2I:
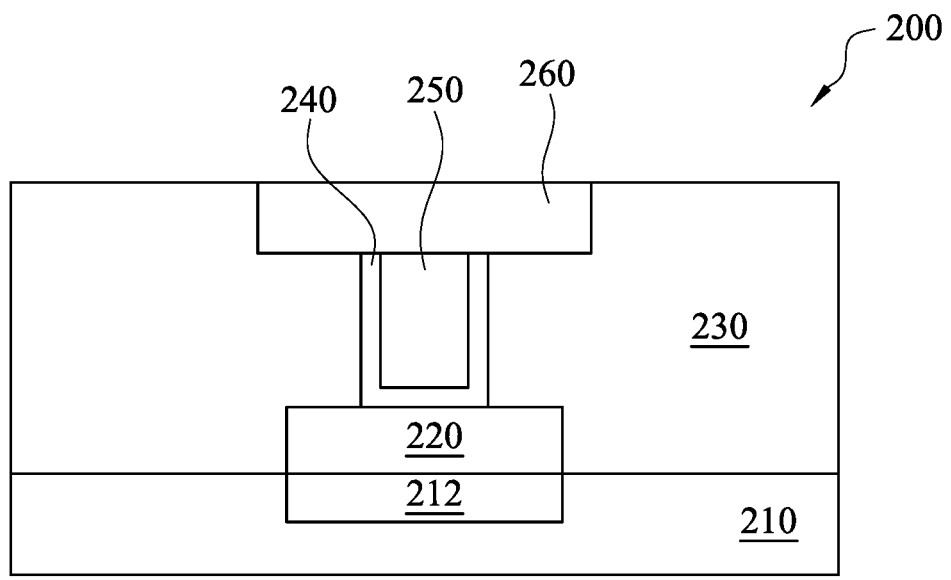

Referring to FIG. 2I, a second conductive layer 260 is formed on the contact via 250 over the first conductive layer 220, thereby forming the semiconductor device 200. In some embodiments, the second conductive layer 260 includes silicon, aluminum, silicide, or copper. In some embodiments, the second conductive layer 260 is formed within a dielectric layer having the same or similar material as the dielectric layer 230 by a suitable process such as a damascene process. The damascene process includes forming a dielectric layer on the substrate, etching the dielectric layer using a mask to form a through hole and expose a portion of the substrate, selectively forming a barrier layer in the through hole, and depositing the conductive layer in the through hole. In some embodiments, the second conductive layer 260 is exposed from the dielectric layer of the semiconductor device 200, thereby electrically connecting the semiconductor device 200 (e.g. an ISP) to another semiconductor device (e.g. an image sensor). It is noted that the dielectric layer for forming the second conductive layer 260 may use the same material as the dielectric layer 230, and thus the dielectric layer may be taken as a part of the single dielectric layer 230 of the semiconductor device 200. Although the above figures illustrate only one glue layer 240 and contact via 250 (i.e. a contact structure) between the first conductive layer 220 and the second conductive layer 260, other numbers (e.g. 2, 3 or more) of the contact structure may be formed in other embodiments according to requirements of devices.

Figure 3A:
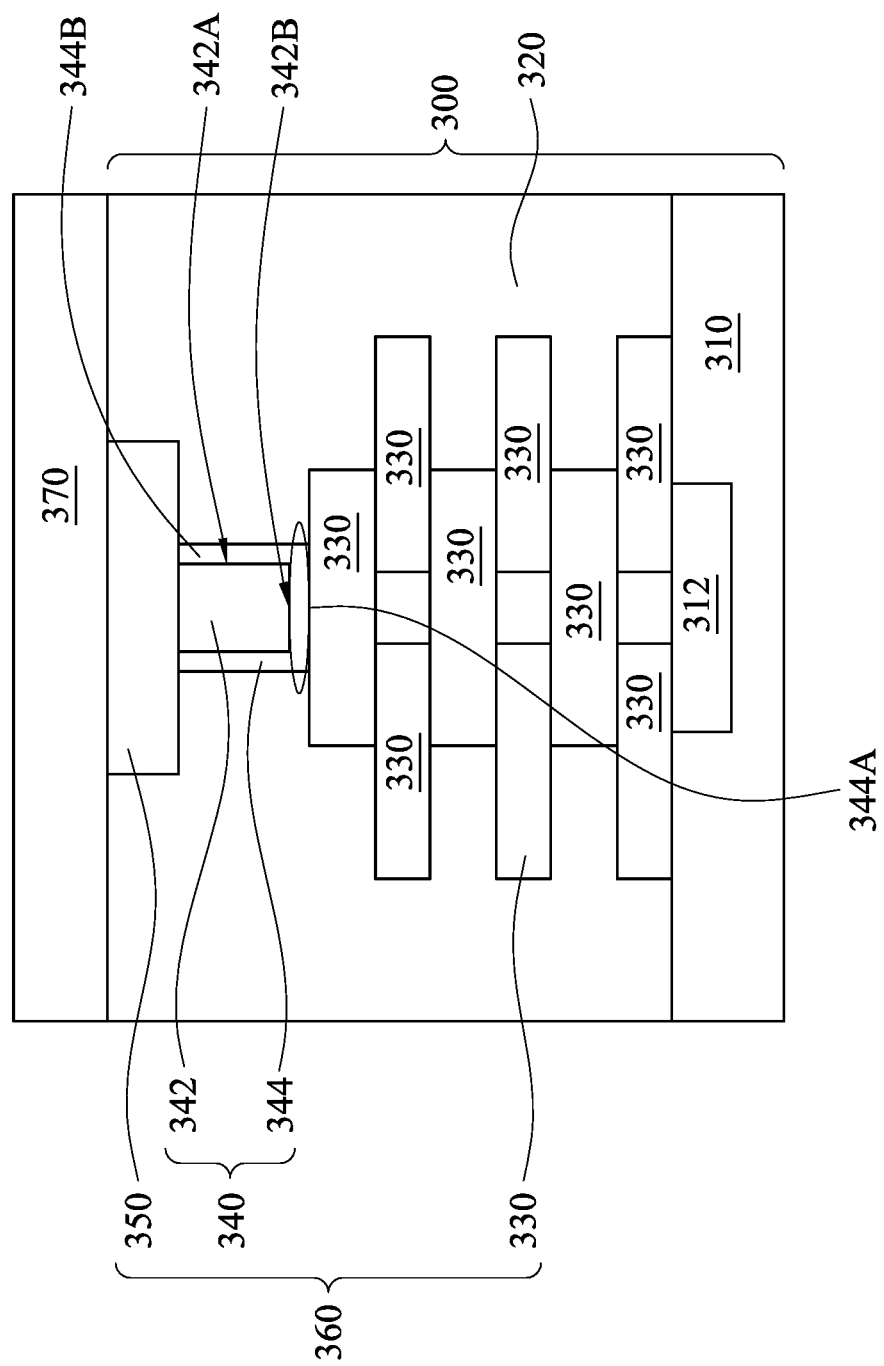
FIG. 3A is a schematic cross-sectional view of a semiconductor device in accordance with some embodiments of the present disclosure.

FIG. 3A is a schematic cross-sectional view of a semiconductor device in accordance with some embodiments of the present disclosure. In FIG. 3A, the semiconductor device 300 includes a substrate 310 having an active device 312 thereon, a dielectric layer 320 and a conductive stack 360 disposed within the dielectric layer 320, in which the conductive stack 360 is electrically connected to the active device 312. The conductive stack 360 includes copper layers 330, a contact structure 340 and an aluminum layer 350, and the contact structure 340 is disposed between the copper layers 330 and the aluminum layer 350. The contact structure 340 includes a contact via 342 and a glue layer 344. The contact via 342 electrically connects the copper layers 330 to the aluminum layer 350. The glue layer 344 is conformal to sidewalls 342A and a bottom surface 342B of the contact via 342. Detailed descriptions of the contact via 342 and the glue layer 344 are similar to the contact via 162 and the glue layer 164 in FIG. 1A and may not be repeated herein. In some embodiments, a number of the copper layers may be six, while any other number may be applied depending on the design of the semiconductor device. In some embodiments, each of two adjacent copper layers 330 may be alternately disposed, while the copper layers may be aligned with each other in other embodiments. In some embodiments, the semiconductor device 300 is an ISP. In some embodiments, the semiconductor device 300 may be further electrically connected to another semiconductor device 370 through the conductive stack 360. In some embodiments, the semiconductor device 370 is a CMOS image sensor.

Figure 3B:
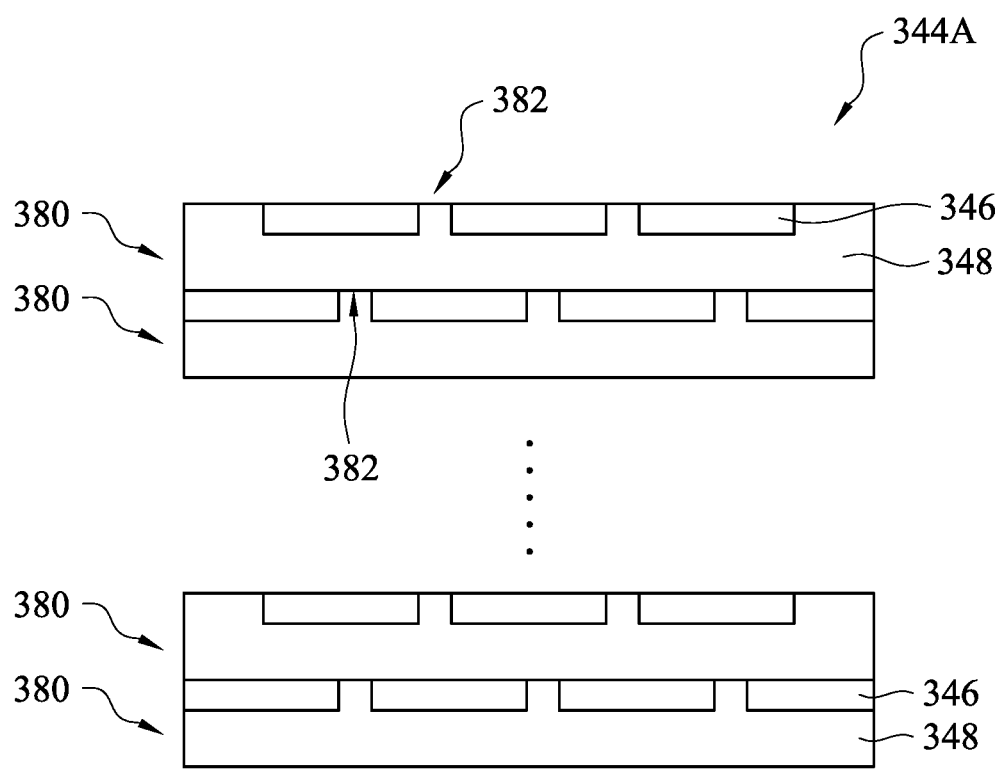
FIG. 3B and FIG. 3C are enlarged views of a microstructure of a bottom portion of a glue layer in accordance with some embodiments of the present disclosure.
Figure 3C:
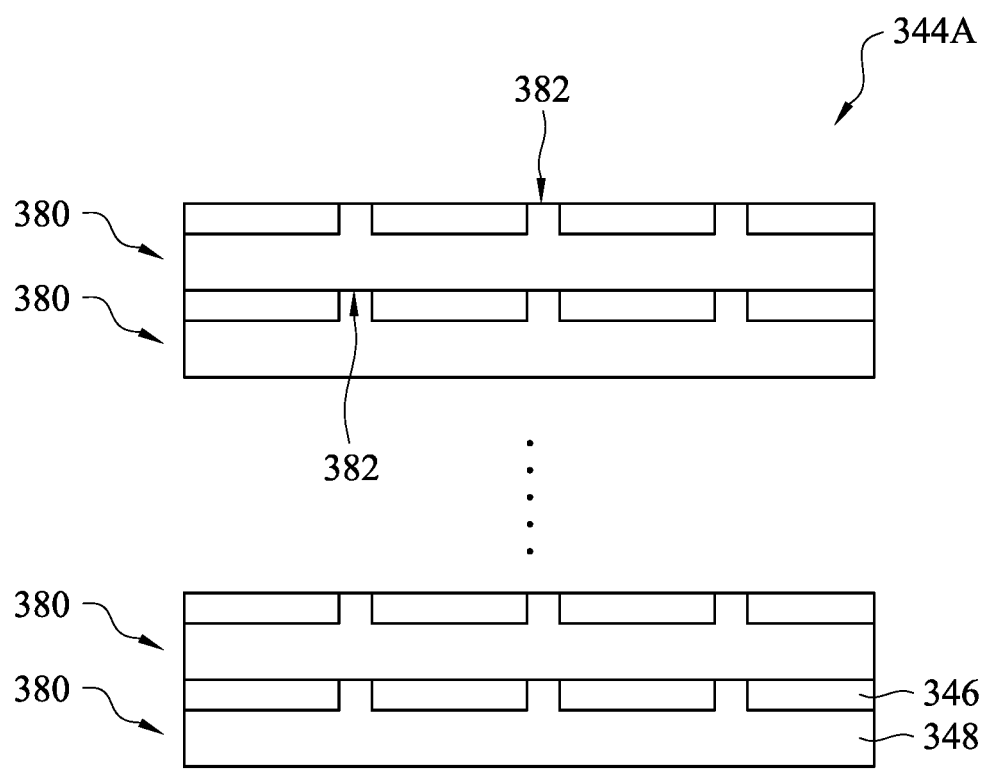

The glue layer 344 has a bottom portion 344A and a sidewall portion 344B both of which have the same microstructures. Hereinafter, only the bottom portion 344A is illustrated in FIG. 3B and FIG. 3C for explanation. Referring to FIG. 3B and FIG. 3C, FIG. 3B and FIG. 3C illustrate enlarged views of microstructures of the bottom portion 344A of the glue layer 344 of FIG. 3A in accordance with some embodiments of the present disclosure. Detailed descriptions of plural isolated lattices 346, an amorphous region 348, sub-layers 380 and a surface 382 of the bottom portion 344A of the glue layer 344 in FIG. 3B and FIG. 3C are similar to the plural isolated lattices 166, the amorphous region 168, the sub-layers 170 and the surface 172 of the bottom portion 164A of the glue layer 164 in FIG. 1B and FIG. 1C and may not be repeated herein.

Figure 4A:
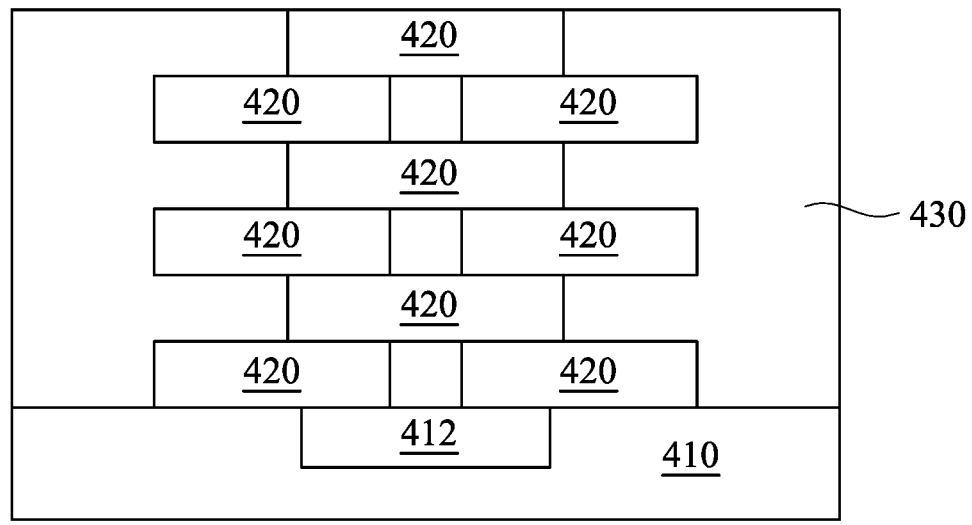
FIG. 4A to FIG. 4J are schematic cross-sectional views of intermediate stages showing a method of forming a semiconductor device in accordance with some embodiments of the present disclosure.

FIG. 4A to FIG. 4I are schematic cross-sectional views of intermediate stages showing a method of forming a semiconductor device in accordance with some embodiments of the present disclosure. In FIG. 4A, copper layers 420 are formed within a dielectric layer 430 on a substrate 410 having an active device 412 thereon, and the active device 412 is electrically connected to the copper layers 420. In some embodiments, a number of the copper layers may be six, while any other number may be applied depending on the design of the semiconductor device. In some embodiments, each of two adjacent copper layers 420 may be alternately disposed, while the copper layers may be aligned with each other in other embodiments. In some embodiments, the dielectric layer 430 may include silicon oxide ($SiO_2$) or any other suitable insulating materials. In some embodiments, the copper layers 420 may be formed in the dielectric layer 430 by the damascene process as described in FIG. 2A and may not be repeated herein.

Figure 4B:
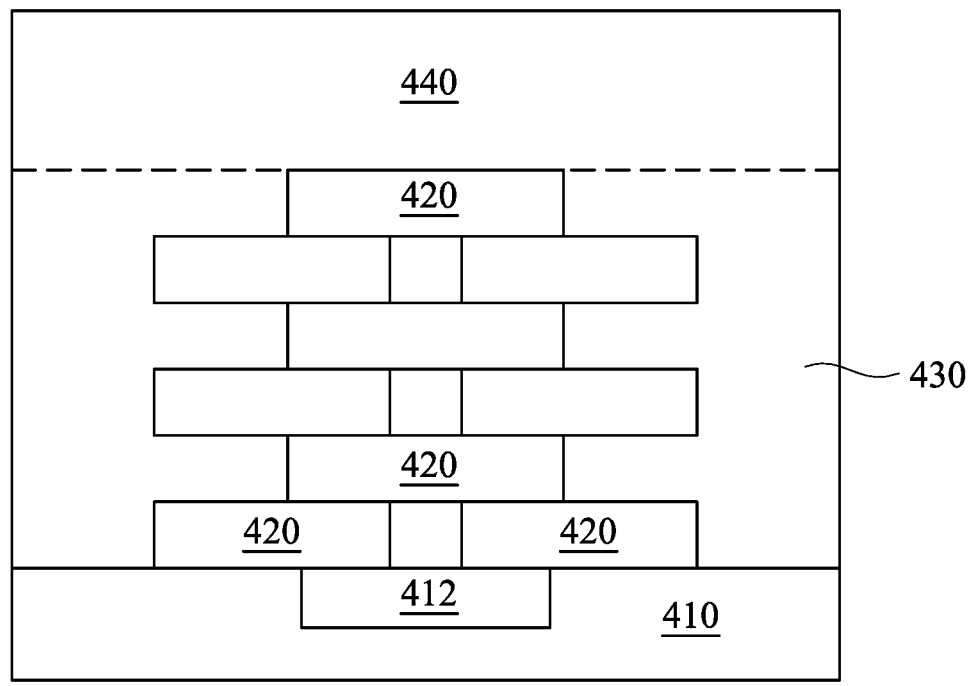

In FIG. 4B, a dielectric layer 440 is then deposited on the copper layers 420, in which a dotted line represents an interface between the dielectric layer 430 and the dielectric layer 440. In some embodiments, the dielectric layer 440 may include the same or similar material as the dielectric layer 430. In some embodiments, depositing the dielectric layer 440 may be performed by any suitable process such as spin-on coating, chemical vapor deposition (CVD), atomic layer deposition (ALD), high density plasma CVD (HPCVD), low pressure CVD (LPCVD), metal organic CVD (MOCVD), remote plasma CVD (RPCVD), plasma enhanced CVD (PECVD) or other suitable processes, or combinations thereof.

Figure 4C:
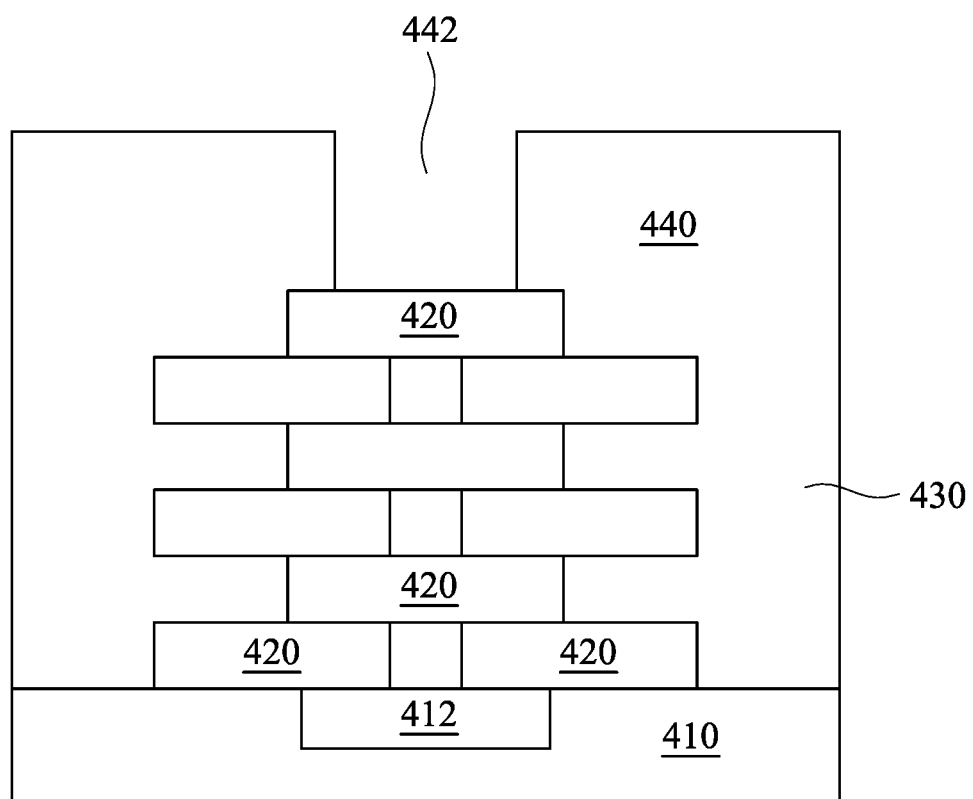

In FIG. 4C, a through hole 442 is formed in the dielectric layer 440, in which the through hole 442 passes through the dielectric layer 440 and exposes a portion of the copper layers 420. The through hole 442 may be formed by patterning a photoresist layer (not shown) formed on the dielectric layer 440, followed by etching the dielectric layer 440 using the patterned photoresist layer as a mask. The photoresist layer is then stripped, leaving the through hole 442 within the dielectric layer 440.

Figure 4D:
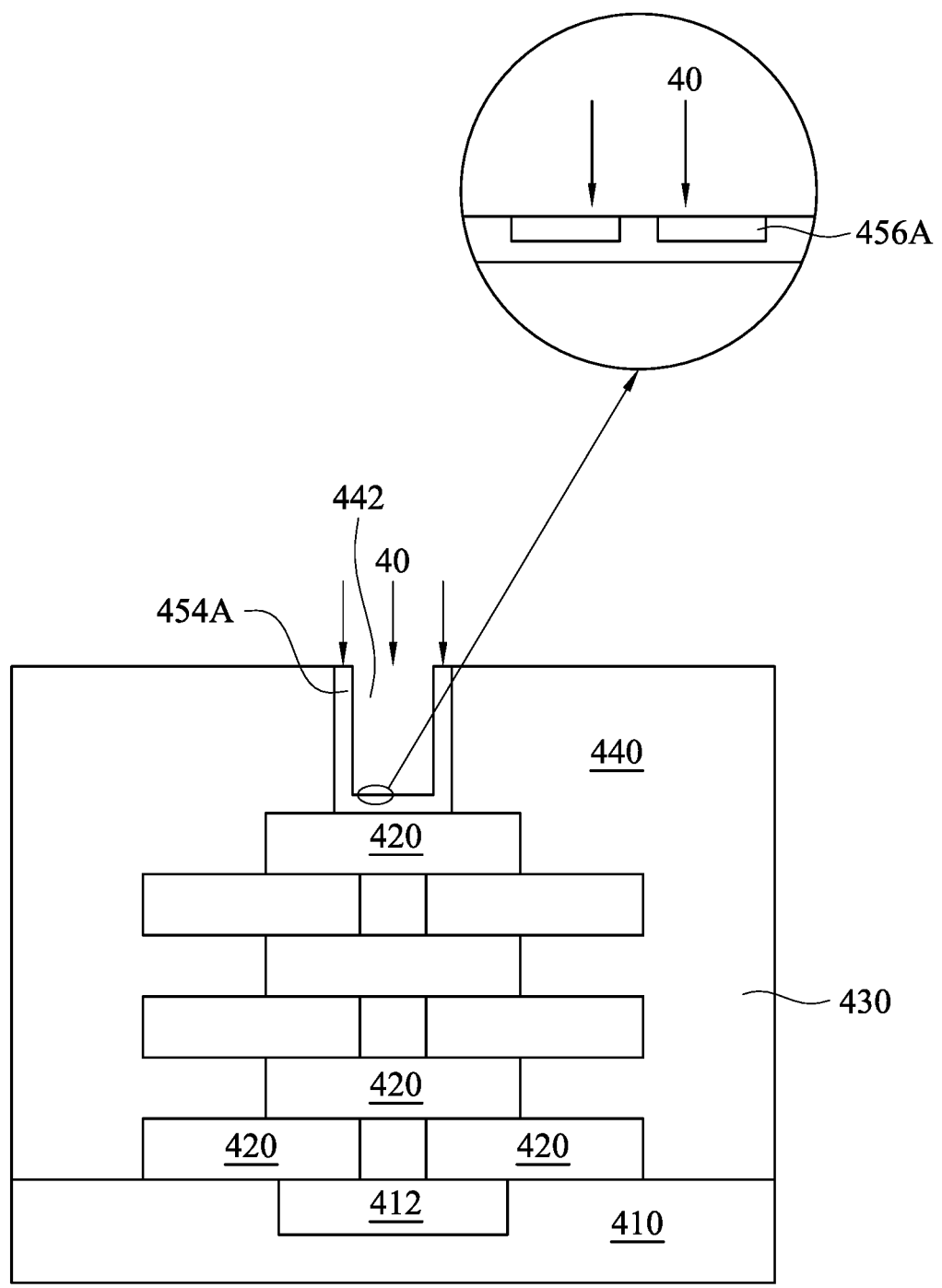
Figure 4E:
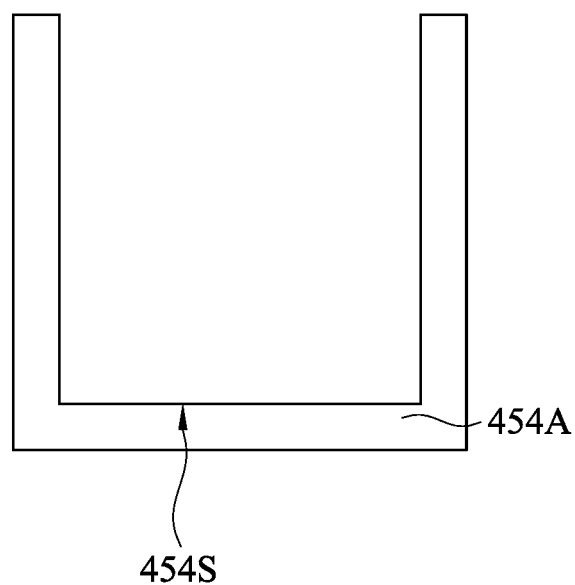
Figure 4F:
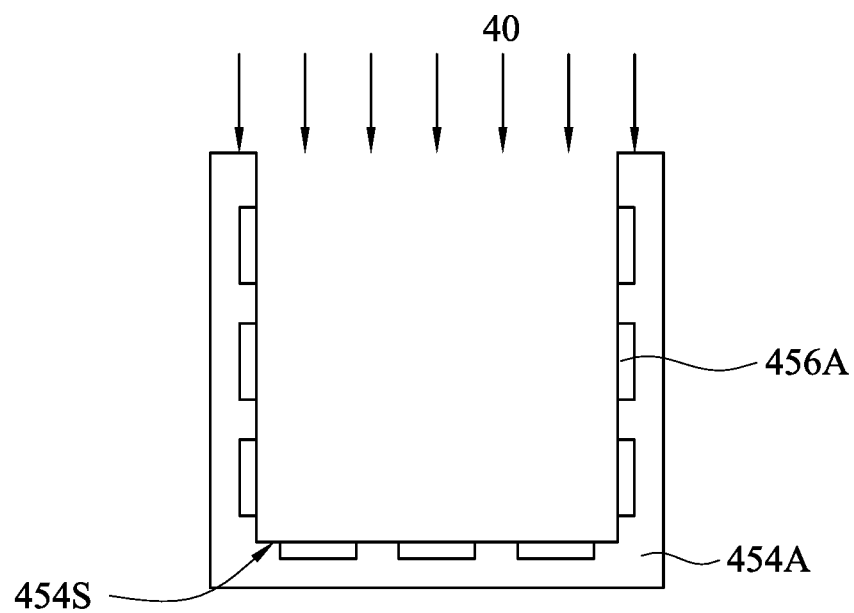
Figure 4G:
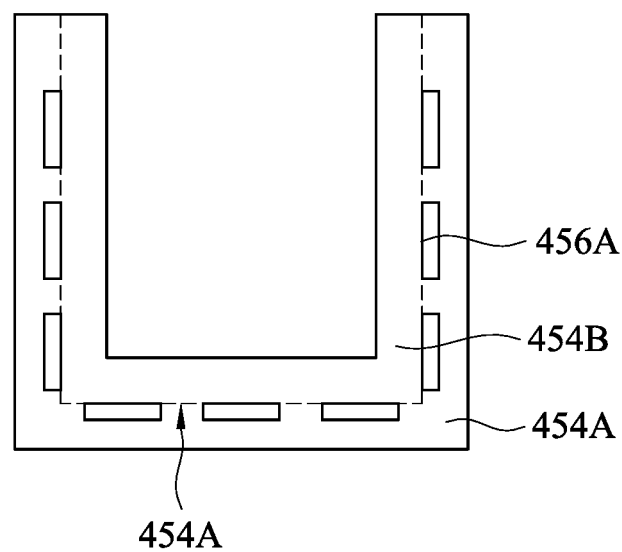
Figure 4H:
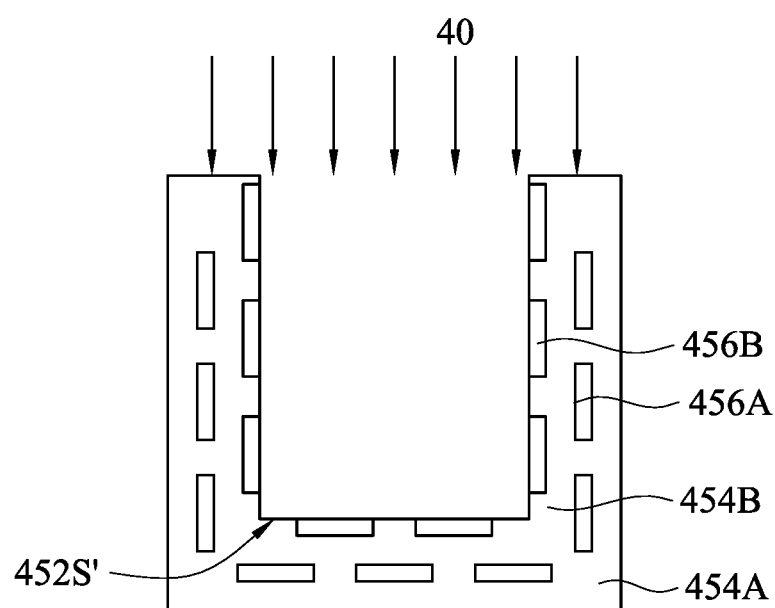
Figure 4I:
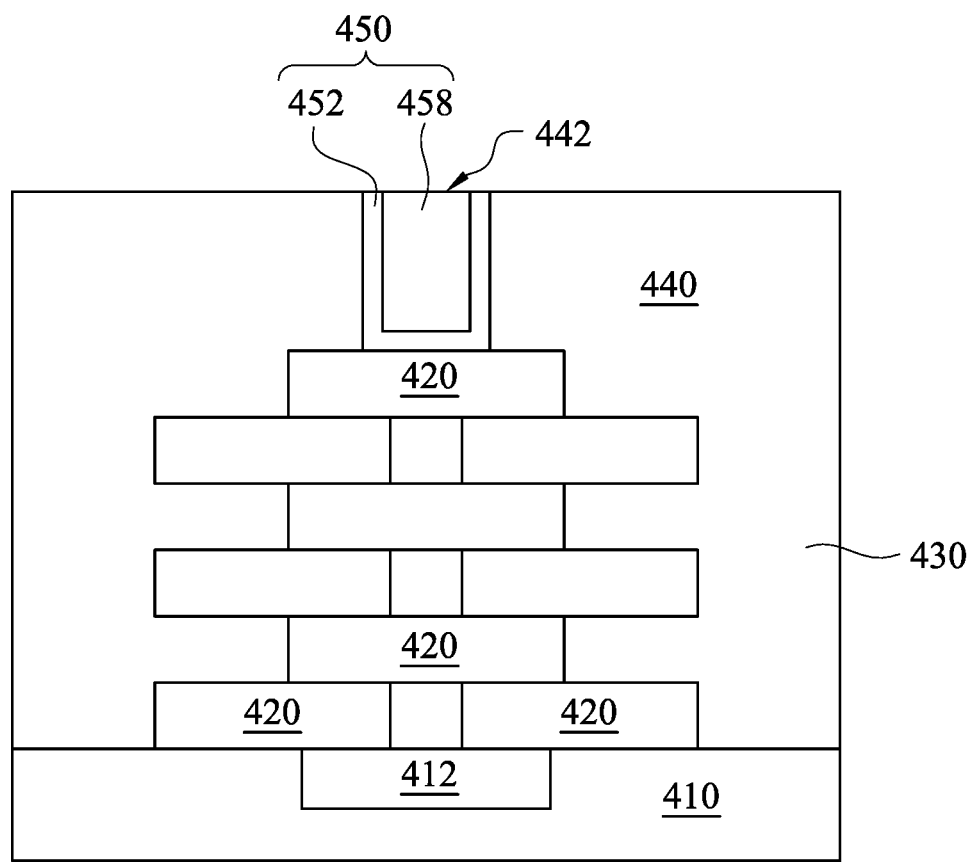

In FIG. 4D, an amorphous layer 454A is conformally deposited in the through hole 442, followed by forming isolated lattices 456A in the amorphous layer 454A by, for example, a low-power plasma operation 40. In FIG. 4E to FIG. 4H, the above operations may be sequentially repeated for several times, and a glue layer 452 (as shown in FIG. 4I) having isolated lattices (e.g. the isolated lattices 456A and isolated lattices 456B) and an amorphous region (formed by amorphous layers, e.g. an amorphous layer 454A and an amorphous layer 454B) at which the isolated lattices are uniformly distributed may be formed. Detailed descriptions of the amorphous layer 454A, the amorphous layer 454B, the isolated lattices 456A, the isolated lattices 456B, a surface 454S, a surface 454S' and a low-power plasma operation 40 of FIG. 4E to FIG. 4H are similar to the amorphous layer 244A, the amorphous layer 244B, the isolated lattices 242A, the isolated lattices 242B, a surface 244S, a surface 244S' and a low-power plasma operation 20 of FIG. 2D to FIG. 2G and may not repeated herein.

Then, as shown in FIG. 4I, a contact via 458 is formed on the glue layer 452 within the through hole 442 by depositing a conductive material, thereby forming a contact structure 450. In some embodiments, the conductive material may be tungsten (W) or any other suitable material. The deposition process for forming the contact via 458 may be similar to the deposition process used for the contact via 250 in FIG. 2I. A chemical mechanical polishing (CMP) may be alternatively performed after the material of the conductive via 458 is deposited, so as to remove excess conductive material and flatten surfaces of the contact via 458 and the dielectric layer 440.

Figure 4J:
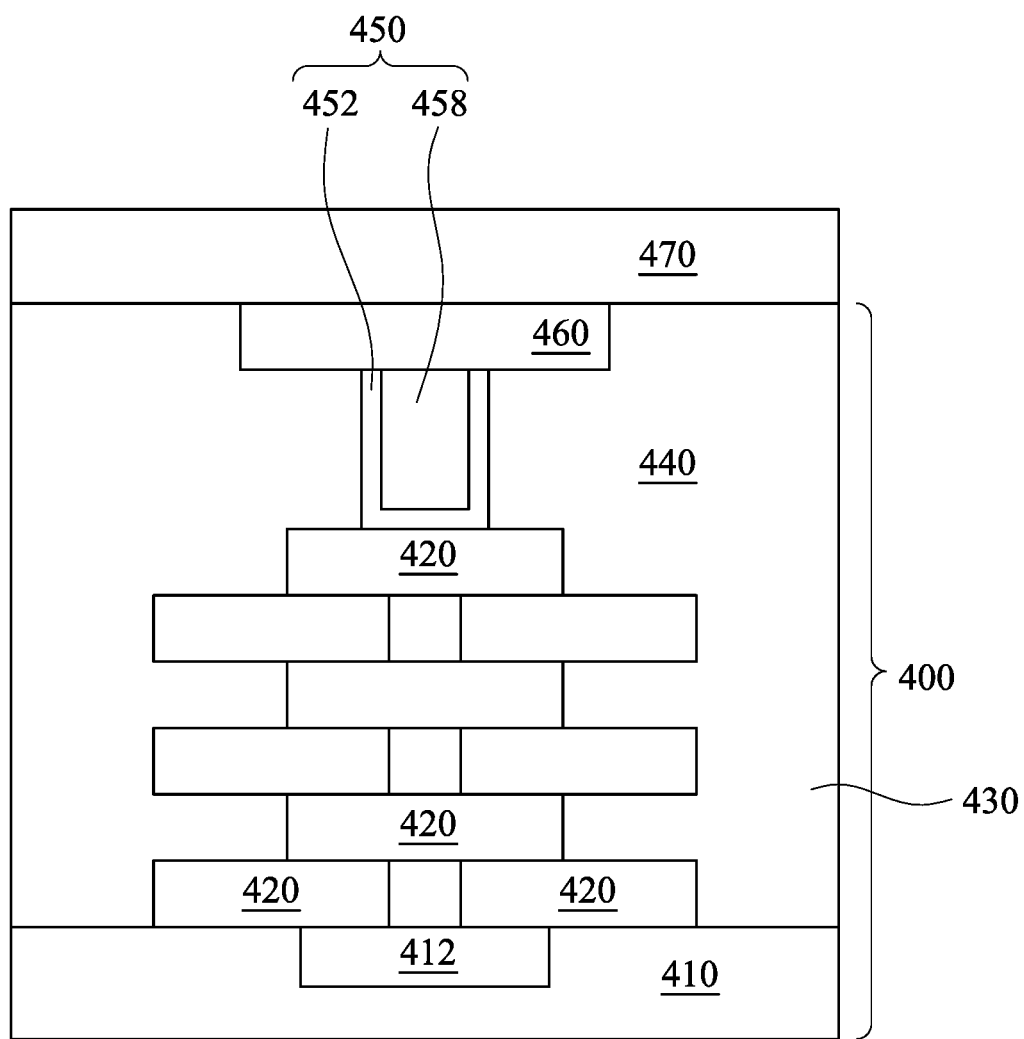

Next, as shown in FIG. 4J, an aluminum layer 460 is formed on the contact via 458 over the copper layers 420, thereby forming a conductive stack of the semiconductor device 400. In some embodiments, the aluminum layer 460 may be formed by the damascene process described above and may not be repeated herein. It is noted that the dielectric layer 430, the dielectric layer 440 and the dielectric layer for forming the aluminum layer 460 may use the same material (e.g. $SiO_2$), and the dielectric layers may be taken as one single dielectric layer 430. In some embodiments, the conductive stack includes the copper layers 420, the contact structure 450 and the aluminum layer 460. In some embodiments, the conductive stack refers to an interconnect structure of the semiconductor device 400, which electrically connects the active device 412 on the substrate 410 to an active device (not shown) of another semiconductor device 470. In some embodiments, the aluminum layer 460 is exposed from the dielectric layer 430 of the semiconductor device 400, thereby electrically connecting the semiconductor device 400 to another semiconductor device 470 by general BEOL techniques. In some embodiments, the semiconductor device 400 may be an ISP, and the semiconductor device 470 may be an image sensor. Although the above figures illustrate only one contact structure 450 between the copper layers 420 and the aluminum layer 460, other numbers (e.g. 2, 3 or more) of the contact structure 450 may be formed in other embodiments according to requirements of devices.

Figure 5:
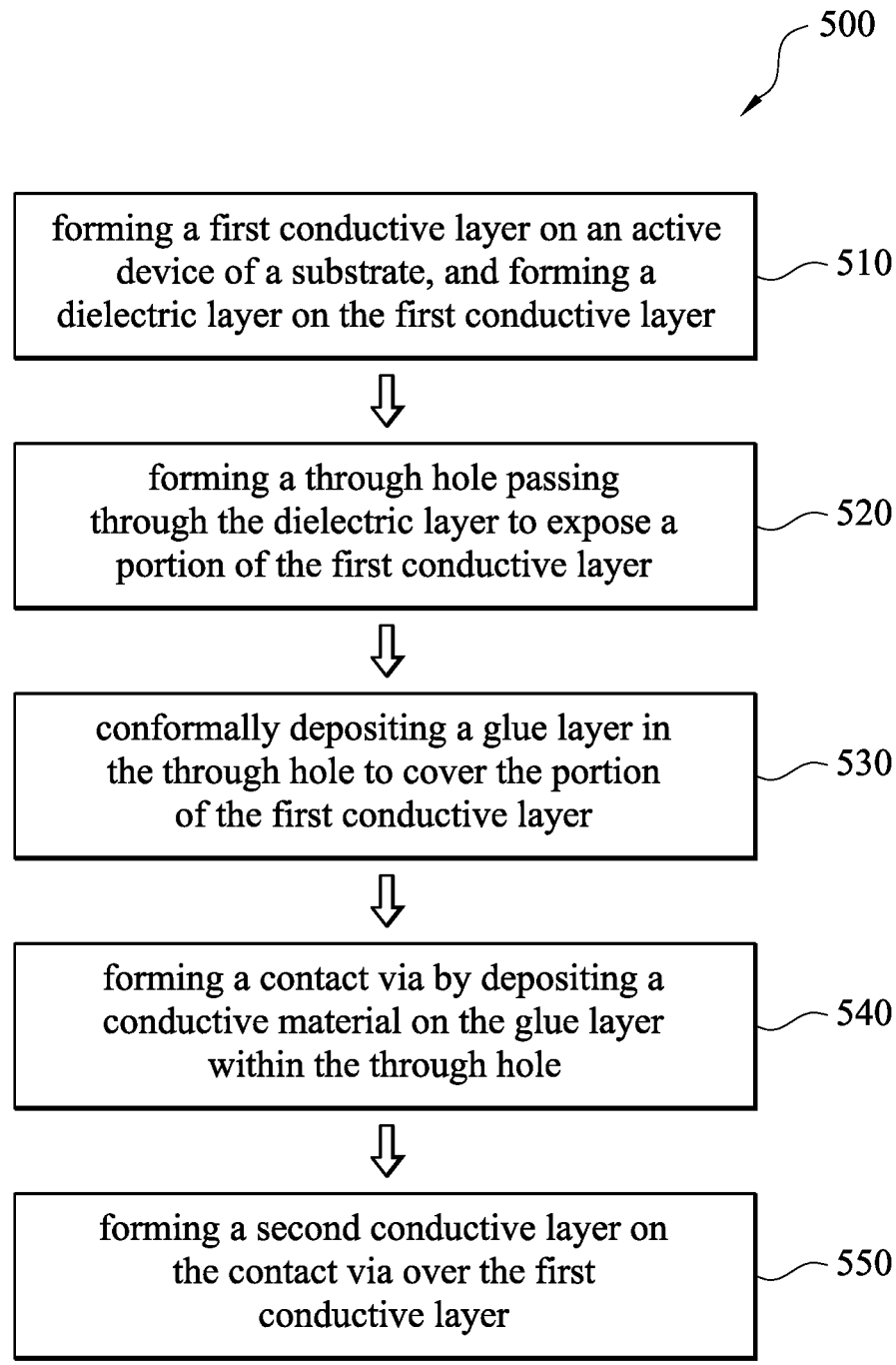
FIG. 5 is a flowchart showing a method of forming a semiconductor device in accordance with some embodiments of the present disclosure.

FIG. 5 is a flowchart showing a method 500 of forming a semiconductor device in accordance with some embodiments of the present disclosure. FIG. 2A to FIG. 2I are incorporated to further describe a process for forming the semiconductor device of the present disclosure. At operation 510, a first conductive layer is formed on an active device of a substrate, and a dielectric layer is formed on a first conductive layer over a substrate, as shown in FIG. 2A. At operation 520, a through hole is formed to pass through the dielectric layer and expose a portion of the first conductive layer, as shown in FIG. 2B. At operation 530, a glue layer is conformally deposited in the through hole to cover the portion of the first conductive layer, as shown in FIG. 2C to FIG. 2G. At operation 540, a contact via is formed by depositing a conductive material on the glue layer within the through hole, as shown in FIG. 2H. At operation 550, a second conductive layer is formed on the contact via over the first conductive layer, as shown in FIG. 2I.

The present disclosure provides a semiconductor device including a conductive stack and a method of forming the same. The conductive stack includes conductive layers and a contact structure disposed between two conductive layers. The contact structure includes a contact via and a glue layer conformally formed on the sidewalls and the surface of the contact via. The glue layer includes isolated lattices uniformly distributed in an amorphous region, in which the carbon content of the amorphous region is substantially in a range of 10 at. % to 30 at. %. The glue layer may be formed by alternately depositing the amorphous layer and performing a low-power plasma operation on the amorphous layer, thereby obtaining the glue layer having a desired content of carbon (i.e. a low density of grain boundaries of the isolated lattices in the glue layer). Diffusion of the elements in the conductive layers and/or in the contact via is effectively restricted, and a conductivity of the conductive stack is properly remained to electrically connect the semiconductor device to another semiconductor device.

In some embodiments, a semiconductor device is provided. The semiconductor device includes a substrate having an active device thereon, a dielectric layer disposed on the substrate, and conductive stack disposed within the dielectric layer. The conductive stack is electrically connected to the active device. The conductive stack includes at least one first conductive layer, a second conductive layer disposed over the at least one first conductive layer, and a contact structure disposed between the at least one first conductive layer and the second conductive layer. The contact structure includes a contact via electrically connecting the at least one first conductive layer to the second conductive layer, and a glue layer conformal to sidewalls and a bottom surface of the contact via. The glue layer has isolated lattices and an amorphous region at which the isolated lattices are uniformly distributed.

In some embodiments, a method of forming a semiconductor device is provided. The method includes the following operations: first, a first conductive layer is formed on an active device of a substrate. Then, a dielectric layer is formed on the first conductive layer over the substrate. Then, a through hole is formed to pass through the dielectric layer and expose a portion of the first conductive layer. Next, a glue layer is conformally deposited in the through hole to cover the portion of the first conductive layer, and the operation includes forming isolated lattices in an amorphous region at which the isolated lattices are uniformly distributed, in which the glue layer has a predetermined thickness. Afterwards, a contact via is formed by depositing a conductive material on the glue layer within the through hole. Then, a second conductive layer is formed on the contact via over the first conductive layer, in which the contact via and the glue layer electrically connect the first conductive layer to the second conductive layer.

In some embodiments, a semiconductor device is provided. The semiconductor device includes a substrate having an active device thereon, a dielectric layer and a conductive stack disposed within the dielectric layer, in which the conductive stack is electrically connected to the active device. The conductive stack includes copper layers, a contact structure and an aluminum layer disposed over the copper layers, and the contact structure is disposed between the copper layers and the aluminum layer. The contact structure includes a contact via and a glue layer. The contact via is electrically connecting the copper layers to the aluminum layer. The glue layer is conformal to sidewalls and a bottom surface of the contact via. The glue layer has isolated lattices and an amorphous region at which the isolated lattices are uniformly distributed.

In some embodiments, A method of forming a semiconductor device, comprising: forming a first conductive layer on an active device of a substrate; forming a dielectric layer on the first conductive layer; forming a through hole passing through the dielectric layer to expose a portion of the first conductive layer; conformally depositing a glue layer in the through hole to cover the portion of the first conductive layer comprising: forming a plurality of isolated lattices in an amorphous region at which the isolated lattices are uniformly distributed and extend from a top surface of the glue layer and terminate prior to reach a bottom of the glue layer, wherein the glue layer has a predetermined thickness; depositing a conductive material on the glue layer within the through hole, thereby forming a contact via; and forming a second conductive layer on the contact via over the first conductive layer, wherein the contact via and the glue layer electrically connect the first conductive layer to the second conductive layer.

In some embodiments, forming the isolated lattices in the amorphous region further comprises alternately depositing an amorphous layer in the through hole and forming the isolated lattices in the amorphous layer, thereby forming the amorphous region having a plurality of amorphous layers.

In some embodiments, depositing the amorphous layer in the through hole is performed by using a reactant gas comprising tetrakis(dimethylamido) titanium (TDMAT).

In some embodiments, forming the isolated lattices in the amorphous layer is performed by a low-power plasma operation.

In some embodiments, the low-power plasma operation performed with a power in a range substantially smaller than about 1000 watts (W). In certain embodiments, the term "about" used in this context means greater or less than the stated value or the stated range of values by a percentage such as 5%, 10%, 15%, etc. of the stated values.

In some embodiments, the low-power plasma operation performed under a pressure in a range substantially from about 1.8 torr to about 2.5 torr.

In some embodiments, the amorphous region contain about 10 at. % to about 30 at. % of carbon.

In some embodiments, the predetermined thickness is in a range substantially from about 235 Å to about 260 Å, and a thickness of the amorphous layer is in a range substantially from about 30 Å to about 40 Å.

In some embodiments, the first conductive layer and the second conductive each comprises silicon, aluminum, silicide, or copper, the glue layer comprises titanium nitride (TiN), and the conductive material comprises tungsten (W).

In some embodiments, A method of forming a semiconductor device, comprising: forming a conductive layer on a substrate; forming a dielectric layer over the conductive layer; etching the dielectric layer to expose the conductive layer; forming a first glue layer with a plurality of first isolated lattices and extending along a sidewall of the dielectric layer and a top surface of the exposed conductive layer; forming a second glue layer with a plurality of second isolated lattices over the first glue layer, wherein each of the second isolated lattices in the second glue layer is spaced apart from each of the first isolated lattices in the first glue layer; and after forming the second glue layer, forming a via in the second glue layer.

In some embodiments, the first isolated lattices of the first glue layer are spaced apart from the dielectric layer.

In some embodiments, the first glue layer is made of titanium nitride.

In some embodiments, the first conductive layer is made of a material different than the via.

In some embodiments, the via is made of tungsten.

In some embodiments, the method further comprises: forming a second conductive layer across the via and the first and second glue layers, wherein the second conductive layer is made of a material different than the via.

In some embodiments, A method of forming a semiconductor device, comprising: forming a first metal-containing layer on a substrate; forming a dielectric layer over the first metal-containing layer; etching the dielectric layer to expose the first metal-containing layer; introducing tetrakis(dimethylamido)titanium and nitrogen-containing gas on the dielectric layer and the exposed first metal-containing layer to form a titanium nitride layer; performing a plasma operation on the titanium nitride layer to form a plurality of isolated lattices; after performing the plasma operation, forming a tungsten via in the titanium nitride layer; and forming a second metal-containing layer landing on the tungsten via and the titanium nitride layer and having a material different than the first metal-containing layer.

In some embodiments, the isolated lattices are spaced apart from the first metal-containing layer.

In some embodiments, a lowest one of the isolated lattices is in a position higher than a bottommost surface of the titanium nitride layer.

In some embodiments, the titanium nitride layer comprises carbon.

In some embodiments, the second metal-containing layer is made of aluminum and in contact with the tungsten via and the titanium nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a copper layer on an active device of a substrate;
   forming a dielectric layer on the copper layer;
   forming a through hole passing through the dielectric layer to expose a portion of the copper layer;
   conformally depositing a glue layer in the through hole to cover the portion of the copper layer comprising:
      forming a plurality of isolated lattices in an amorphous region at which the isolated lattices are uniformly distributed and extend from a top surface of the glue layer and terminate prior to reaching a bottom of the glue layer, wherein the glue layer has a predetermined thickness;
   depositing a tungsten material on the glue layer within the through hole, thereby forming a tungsten contact via;
   forming an aluminum layer on the tungsten contact via over the copper layer,
   wherein the tungsten contact via and the glue layer electrically connect the copper layer to the aluminum layer; and
   forming an image sensor over the aluminum layer, such that the aluminum layer is between the image sensor and the glue layer.

2. The method of claim 1, wherein forming the isolated lattices in the amorphous region further comprises alternately depositing an amorphous layer in the through hole and forming the isolated lattices in the amorphous layer, thereby forming the amorphous region having a plurality of amorphous layers.

3. The method of claim 2, wherein depositing the amorphous layer in the through hole is performed by using a reactant gas comprising tetrakis(dimethylamido) titanium (TDMAT).

4. The method of claim 2, wherein the amorphous region contains 10 at. % to 30 at. % of carbon.

5. The method of claim 2, wherein the predetermined thickness is in a range from 235 Å to 260 Å, and a thickness of the amorphous layer is in a range from 30 Å to 40 Å.

6. The method of claim 2, wherein forming the isolated lattices in the amorphous layer is performed by a plasma operation.

7. The method of claim 1, wherein the aluminum layer is physically in contact with the tungsten contact via.

8. The method of claim 1, wherein a top surface of the tungsten contact via is level with a top surface of the dielectric layer.

9. The method of claim 1, wherein an outermost surface of the glue layer in contact with the dielectric layer is free of the isolated lattices.

10. A method of forming a semiconductor device, comprising:
    forming a copper layer on a substrate;
    forming a dielectric layer over the copper layer;
    etching the dielectric layer to expose the copper layer;
    forming a first glue layer with a plurality of first isolated lattices and extending along a sidewall of the dielectric layer and a top surface of the exposed copper layer;
    forming a second glue layer with a plurality of second isolated lattices over the first glue layer, wherein each of the second isolated lattices in the second glue layer is spaced apart from each of the first isolated lattices in the first glue layer;
    after forming the second glue layer, forming a via embedded in the second glue layer, wherein the via is made of tungsten;
    forming an aluminum layer across the via and the first and second glue layers, wherein a top surface of the via is level with a top surface of the dielectric layer; and
    forming an image sensor over the aluminum layer, such that the aluminum layer is between the image sensor and the first and second glue layers.

11. The method of claim 10, wherein the first isolated lattices of the first glue layer are spaced apart from the dielectric layer.

12. The method of claim 10, wherein the first glue layer is made of titanium nitride.

13. The method of claim 12, wherein an amorphous region of the first glue layer forms a titanium nitride/copper interface with the copper layer.

14. The method of claim 10, wherein the aluminum layer is physically in contact with the via.

15. The method of claim 10, wherein an outermost surface of the first glue layer in contact with the dielectric layer is free of the first isolated lattices.

16. A method of forming a semiconductor device, comprising:
    forming a copper layer on a substrate;
    forming a dielectric layer over the copper layer;
    etching the dielectric layer to expose the copper layer;
    introducing tetrakis (dimethylamido) titanium and nitrogen-containing gas on the dielectric layer and the exposed copper layer to form a titanium nitride layer;
    performing a plasma operation on the titanium nitride layer to form a plurality of isolated lattices;
    after performing the plasma operation, forming a tungsten via in the titanium nitride layer;
    forming an aluminum-containing layer landing on and physically in contact with the tungsten via and the titanium nitride layer, wherein a top surface of the tungsten via is level with a top surface of the dielectric layer; and forming an image sensor over the aluminum-containing layer, such that the aluminum-containing layer is between the image sensor and the titanium nitride layer.

17. The method of claim 16, wherein the isolated lattices are spaced apart from the copper layer.

18. The method of claim 16, wherein the titanium nitride layer comprises carbon.

19. The method of claim 16, wherein the titanium nitride layer continuously extends from the copper layer to the aluminum-containing layer.

20. The method of claim 16, wherein an outermost surface of the titanium nitride layer in contact with the dielectric layer is free of the isolated lattices.

\* \* \* \* \*